SEMICONDUCTOR DEVICE WITH TERMINALS ADAPTED FOR MASS FABRICATION

Filed Feb. 12, 1968 2 Sheets-Sheet 1

INVENTORS
ERNST GINSBERG
OSWALD HAKE
NORBERT KIRCHNER
EDWARD UDEN
HELMUT ZITTLAU
WILHELM SCHREIHAGE

BY

AGENT

INVENTORS
ERNST GINSBERG
OSWALD HAKE
NORBERT KIRCHNER
EDWARD UDEN
HELMUT ZITTLAU
WILHELM SCHREIHAGE
BY
AGENT

United States Patent Office 3,555,371

Patented Jan. 12, 1971

3,555,371

SEMICONDUCTOR DEVICE WITH TERMINALS ADAPTED FOR MASS FABRICATION

Ernst Ginsberg, Hamburg-Bramfeld, Oswald Hake, Hamburg, Norbert Kirchner, Hamburg-Altona, Edward Uden, Hamburg, Helmut Zittlau, Hamburg-Schnelsen, and Wilhelm Schreihage, Hamburg, Germany, assignors to U.S. Philips Corporation, New York, N.Y., a corporation of Delaware Filed Feb. 12, 1968, Ser. No. 704,693

Claims priority, application Germany, Mar. 17, 1967, P 41,668

Int. Cl. H01l 3/00, 5/00

U.S. Cl. 317—234 3 Claims

ABSTRACT OF THE DISCLOSURE

Novel semiconductor devices comprise a semiconducting body, a plurality of electrodes parallel to each other on one surface of said body, a corresponding number of parallel cross-pieces mounted in a header, the direction of length of each cross-piece being at right angles to the direction of length of the electrodes, the cross-pieces being secured to a corresponding number of terminal posts placed in the header. The cross-pieces may be metal strips, the upper edges of which are connected with the associated electrodes or may be printed conductors. The novel semiconductor devices may be completely manufactured by automatic machinery.

Figure 1:
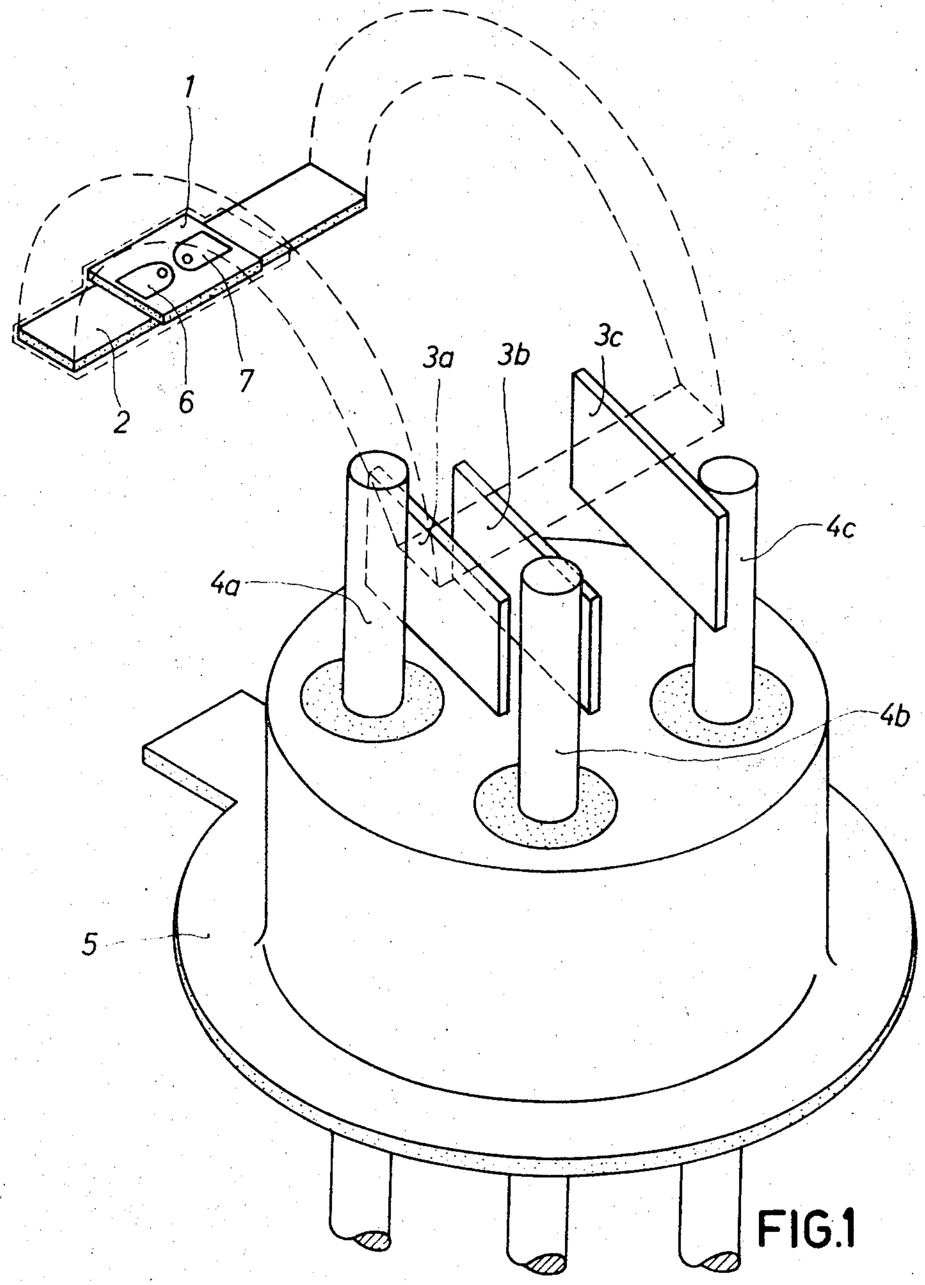

The invention relates to a semiconductor device provided with contacts.

As a rule, semiconductor devices comprise the semiconductor body proper and an array of supply leads which may include an envelope and the individual conductors which are connected to the electrodes of the semiconductor body. The electrodes of the semiconductor body are normally connected to the connecting leads by securing thin connecting wires to the electrodes of the semiconductor body and to the supply leads by thermo-compressing bonding. Especially in very small semiconductor bodies, this connecting process acn only be performed by hand with the aid of suitable micromanipulators and hence accounts for a considerable part of the entire manufacturing cost of a semiconductor device. Since in the manufacture of a semiconductor device almost all the other steps can be effected automatically or at least simultaneously on a large number of devices, efforts are made to mechanize the making of connections between the electrodes of the semiconductor body to be contacted and the supply leads.

Several special embodiments of semiconductor devices and supply leads have been proposed for mechanizing the connecting process. Summarizing, reference is made to the United States Pats. 2,795,745 and 3,153,751. The embodiment described in U.S. Pat. 3,153,751 in which the semiconductor body is mounted in a frame between electrode connectors has the disadvantage of being suitable only for alloyed semiconductor devices in which the alloyed electrodes are arranged on opposite surfaces of the semiconductor body. In the embodiment described in U.S. Pat. 2,795,745 the semiconductor body rests only on the electrodes without being firmly secured to them, and the area of the entire assembly is many times the area of the semiconductor body. Further, the semiconductor body must be positioned in the direction of the longitudinal axis with a precision such that the body cannot be arranged on the electrodes by machine without post-adjustment.

It is an object of the present invention to obviate the disadvantages of the known arrangements and to provide a semiconductor device the semiconductor body of which is provided with flat electrodes and yet can simply be mechanically connected to a conventional array of supply leads, for example, a printed wiring panel or a case of the TO-series, without post-adjustment and without the use of the usual thermo-compression bonding process. This problem is solved by a semiconductor device which is characterized in that all the electrodes to be provided with contacts are situated parallel to one another on one surface of the device in one or more parallel planes and are placed on, and conductively to, narrow parallel cross-pieces which are spaced from the electrodes, the upper edge of each cross-piece lying in the plane of the associated electrode and the direction of length of each cross-piece being at right angles to the direction of length of the electrodes.

The semiconductor device may comprise a semiconductor crystal soldered to a strip of metal which forms one of the electrodes. The remaining electrodes consist of metal layers which are applied to the semiconductor crystal and extend in the direction of length of the metal strip which carries the semiconductor crystal.

The cross-pieces preferably consist of parallel strips of metal which each have one large surface secured to the terminal posts of a header and an upper small surface connected to the respective electrode.

The cross-pieces may be printed conductors on a suitable board or panel which are connected to the connecting leads. The electrodes are connected to the cross-pieces preferably by a conductive adhesive or a solder which is applied to the cross-pieces or the electrodes of the crystals before the semiconductor device is placed in position.

In order that the tolerances permissible in the positioning of the device on the cross-pieces may be maintained as large as possible, the width of the electrodes (in the direction of length of the device) is large compared with the width of the cross-pieces. The layers deposited on the crystal from the vapour phase for enlarging the areas of the electrodes and the cross-pieces form stray capacitances with one another and with the crystal. Hence, they must not be longer than necessary and as narrow as possible, and the longitudinal dimension of the electrodes must be at right angles to that of the cross-pieces.

A semiconductor device in accordance with the invention provides the advantage that the semiconductor body, which may be made by planar techniques, can be positioned on conductive connecting cross-pieces and connected thereto by machine. This eliminates the need for the laborious and time-consuming provision of connecting leads between the electrodes of the semiconductor device and the terminal posts of the header by hand with the aid of the conventional thermo-compression process. The precision with which the semiconductor body is positioned on the cross-pieces may be comparatively low, and is limited in the direction of length of the cross-pieces only by their length and at right angles to this direction only by the length of the electrodes provided on the semiconductor body.

Figure 2:
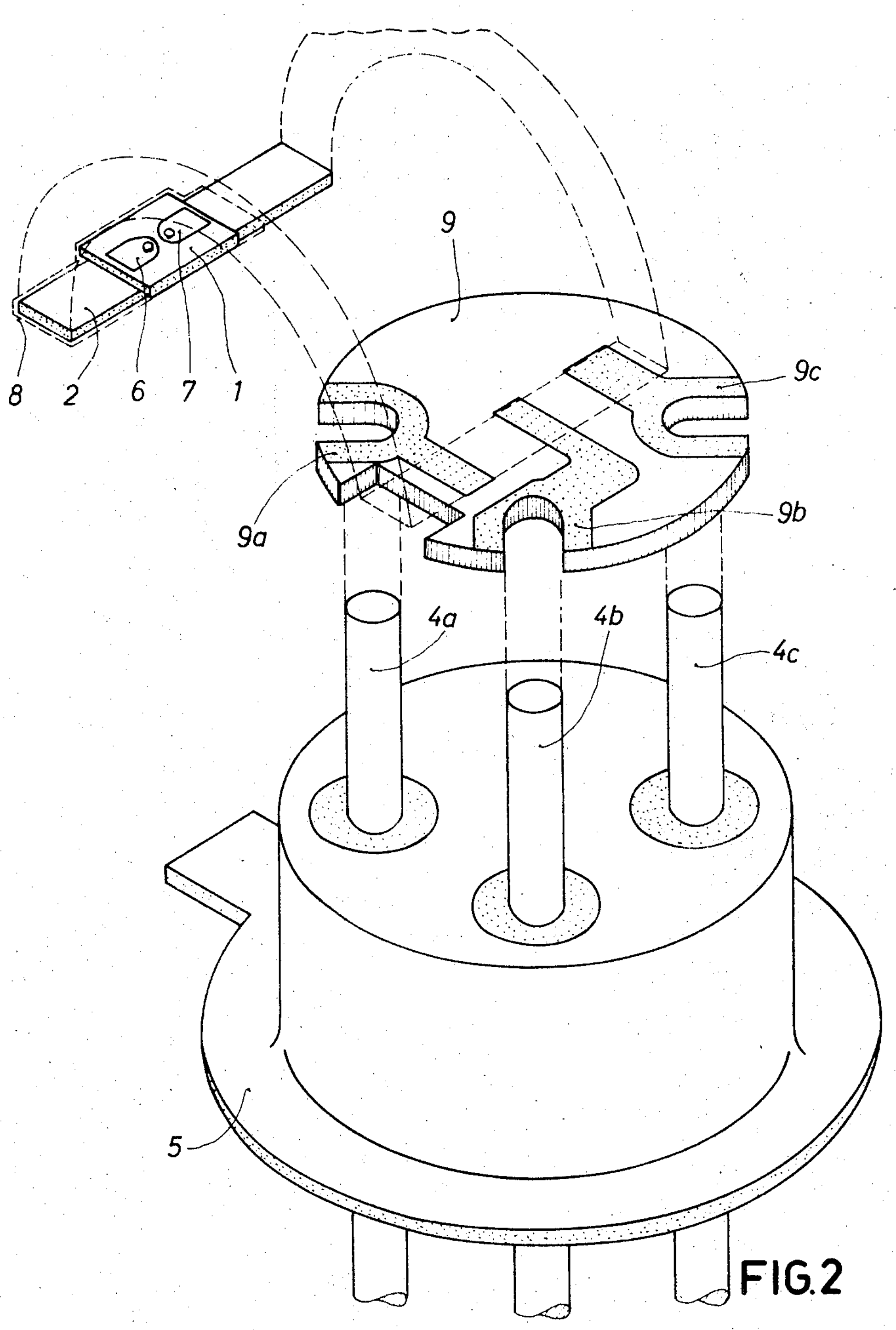

In order that the invention may readily be carried into effect, two embodiments thereof will now be described, by way of example, with reference to the accompanying drawing, in which FIG. 1 shows a semiconductor device in accordance with the invention prior to the securing of the semiconductor body to the connecting leads the cross-pieces being constituted by metal strips the direction of length of which at right angles to the direction of length of the electrodes, and FIG. 2 shows a semiconductor device similar to that of FIG. 1 in which the cross-pieces are metal layers applied to a support.

FIG. 1 shows, by way of example, a semiconductor body 1 in the form of a transistor which is to be connected to terminal posts 4*a* to 4*c* of a usual transistor header 5 which may, for example, be of the type TO–18.

The semiconductor body 1 is soldered to a metal strip 2 which thus forms a terminal connection for one of the regions of the transistor, for example, the collector region. The base and emitter regions on the opposite side of the body are connected to electrodes 6 and 7, respectively, provided by deposition from vapour which are situated opposite one another and extend away from one another in the direction of the largest dimension of the contact strip 2.

By simple mechanical means the semiconductor body provided with electrodes 2, 6 and 7 may be arranged, as is indicated by broken lines, with the side carrying electrodes 6 and 7 down on three conductive cross-pieces 3*a*, 3*b* and 3*c* in a manner such that each of the electrodes 2, 6 and 7 rests on a single associated cross-piece.

The cross-pieces 3*a*, 3*b* and 3*c* are metal strips disposed on edge and parallel to one another which are welded to the three posts 4*a*, 4*b* and 4*c* of the header so that the upper surface of each cross-piece lies in the plane of the associated electrode, that is to say, the upper faces of the cross-pieces 3*a* and 3*b* on the same level in the plane of the electrodes 6 and 7 and the upper face of the cross-piece 3*c* slightly higher in the plane of the metal strip 2.

The electrodes 2, 6 and 7 may be conductively connected to the cross-pieces 3*a* to 3*c* by soldering, preferably with gold as the solder, or more simply by sticking the cross-pieces to the electrodes by means of a conductive epoxy resin applied by a suitable device prior to placing the crystals provided with the electrodes on the cross-pieces.

FIG. 2 shows a second embodiment of a semiconductor device with contacts in accordance with the invention, which is only distinguished from the embodiment of the FIG. 1 in that the cross-pieces to which the electrodes 2, 6 and 7 of the semiconductor body 1 are connected comprise printed conductors 9*a*, 9*b* and 9*c* on a panel or board 9. The conductors are connected to the terminal posts 4*a*, 4*b* and 4*c* of a header 5 either by soldering or by a conductive adhesive. In FIG. 2, the board or panel is shown separate from the posts for the sake of clarity.

In positioning the semiconductor body on the cross-pieces the accuracy in the direction of length of the electrodes 2, 6 and 7 is defined only by the lengths of the electrodes and the mutual spacings of the cross-pieces. The positioning accuracy in a direction at right angles thereto is defined only by the length of the cross-pieces 3*a* to 3*c* or 9*a* to 9*c*, and this may be comparatively large, for example, twice the width of the crystal. The mechanical apparatus for placing the semiconductor body on the cross-pieces need not satisfy stringent requirements in respect of its location accuracy.

The semiconductor body to be connected to the terminal posts may be a diode, a transistor or any other semiconductor device, but especially an integrated circuit. In such integrated circuits the number of the electrodes to be connected to supply leads normally is materially higher than in the other semiconductor devices so that the above-mentioned advantages of the invention will be markedly manifest.

What is claimed is:

1. A semiconductor device which comprises in combination a semiconducting body and a header therefor, a plurality of insulated terminal posts in the header, said semiconducting body having at least one electrode on a front surface in one plane and at least another electrode on a back surface in a different plane parallel to said one plane, said other electrode being a metal strip bonded to the back surface of the body and having a longitudinal direction and extending beyond the body to expose a front surface for connection, said one electrode being a metal layer on the body and extending parallel to the longitudinal direction of the metal strip a distance shorter than the amount that the metal strip extends beyond the body thereby leaving exposed the front surface of the latter for connection, and plural conducting members each comprising narrow metal strips, each of said conducting members being secured in transverse relation along its major surface to a terminal post, said conducting members being aligned in spaced apart relationship with substantially parallel edges, an upper edge surface of each of the conducting members lying in the plane of and connected to a different electrode, the length direction of the strip conducting members being at right angles to the longitudinal direction of the electrodes.

2. The semiconductor device according to claim 1 wherein the length of the electrodes in the longitudinal direction is large in relation to the width of the upper edge surface of the conducting members.

3. The semiconductor device according to claim 1 which is a transistor comprising three electrodes, two on a front surface and one on a back surface of the semiconducting body.

References Cited

UNITED STATES PATENTS

| | | | |
|---|---|---|---|
| 3,235,937 | 2/1966 | Lanzl | 29—25.3 |
| 3,264,712 | 8/1966 | Hayashi | 29—155.5 |
| 3,108,209 | 10/1963 | Knowles | 317—234 |
| 3,363,146 | 1/1968 | Dijkmeijer et al. | 317—101 |
| 3,450,956 | 6/1969 | Bauer et al. | 317—234 |
| 3,021,461 | 2/1962 | Oakes et al. | 317—235 |

FOREIGN PATENTS

| | | | |
|---|---|---|---|
| 636,567 | 2/1962 | Canada | 317—234X |

OTHER REFERENCES

IBM Technical Disclosure, vol. 8, No. 11, April 1966.

JOHN HUCKERT, Primary Examiner

B. ESTRIN, Assistant Examiner

U.S. Cl. X.R.

317—235; 29—589, 591